(12) United States Patent
Ozmat et al.

(10) Patent No.: US 6,377,461 B1
(45) Date of Patent: Apr. 23, 2002

(54) POWER ELECTRONIC MODULE PACKAGING

(75) Inventors: Burhan Ozmat, Voorheesville; Mustansir Hussainy Kheraluwala, Niskayuna; Eladio Clemente Delgado, Burnt Hills; Charles Steven Korman, Niskayuna; Paul Alan McConnelee, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/710,237

(22) Filed: Nov. 10, 2000

Related U.S. Application Data

(62) Division of application No. 09/431,415, filed on Nov. 1, 1999.

(51) Int. Cl.[7] .................................................. H05K 7/20
(52) U.S. Cl. ...................... 361/704; 361/697; 361/699; 361/719; 165/104.33; 174/16.3; 257/722
(58) Field of Search ................................ 361/688, 689, 361/700–710, 712, 713, 790, 676, 714–721, 722, 754; 257/686, 706–727, 709, 668, 679, 796, 700–703; 174/16.3, 52.1, 252, 255, 15.2; 165/80.3, 80.4, 185, 104.33, 104.34; 307/150; 438/6, 106, 107, 110, 108, 138; 324/72.5, 754, 840, 739, 890; 439/66

(56) References Cited

U.S. PATENT DOCUMENTS

| | | | |
|---|---|---|---|
| 4,766,481 A | * 8/1988 | Gobrecht et al. | ............. 357/80 |
| 4,926,241 A | * 5/1990 | Carey | ............. 357/75 |
| 5,353,195 A | 10/1994 | Fillion et al. | |
| 5,353,498 A | 10/1994 | Fillion et al. | |
| 5,497,033 A | 3/1996 | Fillion et al. | |
| 5,532,512 A | 7/1996 | Fillion et al. | |
| 5,637,922 A | 6/1997 | Fillion et al. | |
| 5,841,193 A | 11/1998 | Eichelberger | |
| 5,841,194 A | * 11/1998 | Tsukamoto | ............. 257/729 |
| 5,904,499 A | * 5/1999 | Pace | ............. 438/108 |
| 5,986,338 A | * 11/1999 | Nakajima | ............. 257/700 |
| 6,014,313 A | * 1/2000 | Hesselbom | ............. 36/704 |
| 6,057,612 A | * 5/2000 | Temple | ............. 307/150 |
| 6,060,795 A | * 5/2000 | Azotea et al. | ............. 307/150 |

* cited by examiner

*Primary Examiner*—Leo P. Picard
*Assistant Examiner*—Michael Datskovsky
(74) *Attorney, Agent, or Firm*—Jill M. Breedlove; Christian G. Cabou

(57) ABSTRACT

A method of power electronic packaging includes a practicable and reliable method of fabricating power circuit modules and associated connections that are compatible with the standard top layer metalization of commercially available power devices. A planar single- or multi-layer membrane structure is attached to a carrier frame, and a via pattern is formed in the membrane. Power devices are aligned and attached to the planar membrane structure; a top layer interconnect structure is formed by metalizing the vias and the film; and a circuit is formed by patterning a deposited metal layer. The carrier frame is removed, and upper and lower thermal base plate sub-assemblies are attached to the power device-on-membrane structure. The planar device-on-membrane structure accommodates different types of power devices having variations in thickness. The thermal base plate sub-assemblies may include integral, high-performance heat exchangers for providing a low thermal resistance path to the ambient.

15 Claims, 7 Drawing Sheets

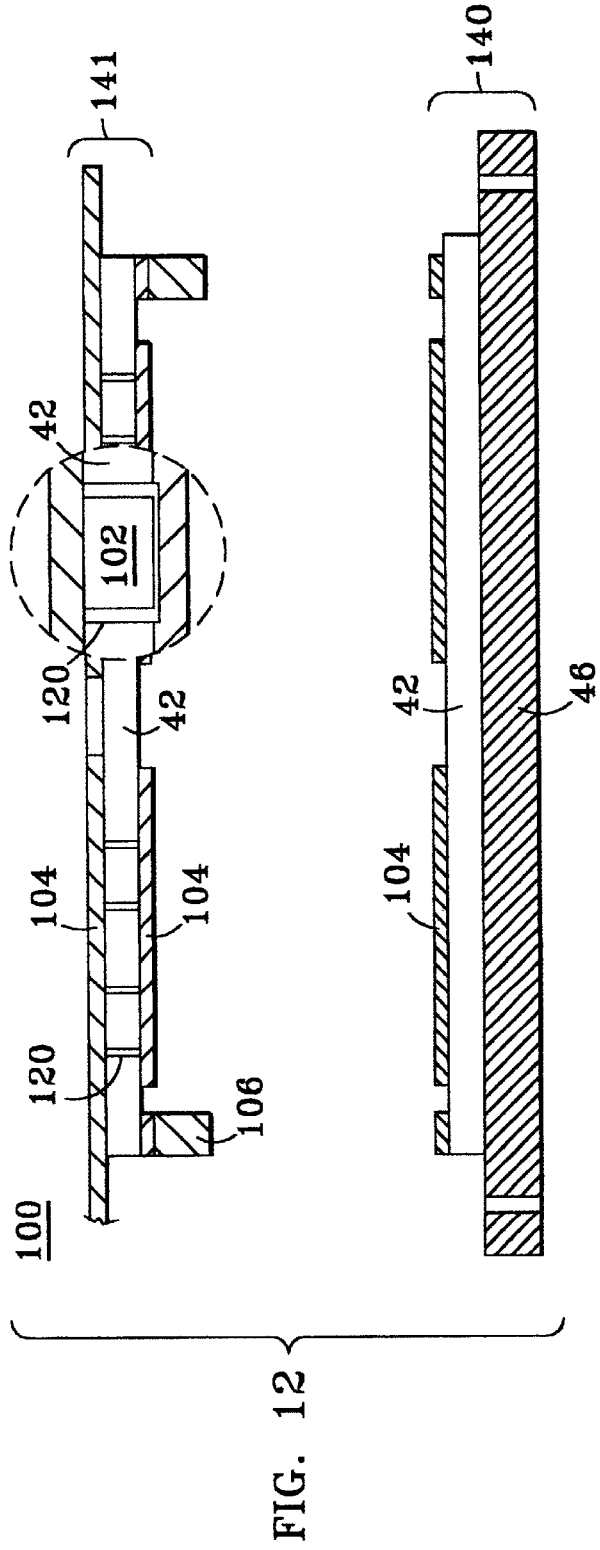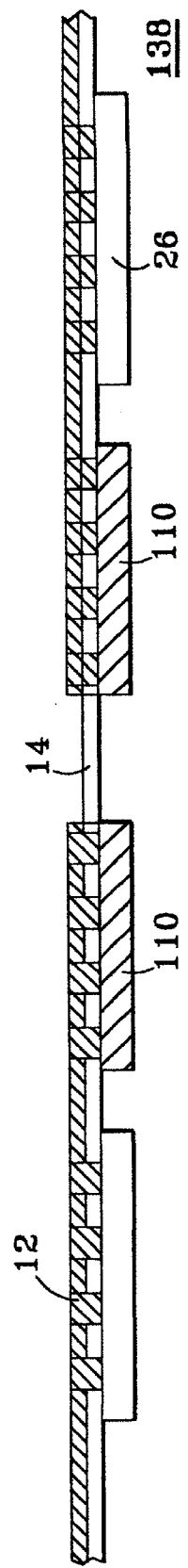

POWER ELECTRONIC MODULE PACKAGING

This application is a division of application Ser. No. 09/431,415, filed Nov. 1, 1999 which is hereby incorporated by reference in its entirety.

BACKGROUND OF THE INVENTION

The present invention relates generally to electronic packaging technology and, more particularly, to electronic packaging technology applicable to power modules, such as ac-ac, ac-dc and dc-ac converters and electronic switches.

Typical power module designs employ wire bonds for connecting power devices to power busses and control terminals. The power devices are commonly soldered onto a metalized insulating ceramic substrate, often beryllium oxide or aluminum nitride metalized with a conductive metal such as copper or aluminum, and subsequently bonded to a massive copper heat spreader. Typically, an injection molded polymer shell covers the module, exposing only the input/output and control terminals and the copper heat spreader. The heat spreader is attached to a heat sink, such as extruded aluminum fins or a cold plate, for example. Thermal contact between the heat spreader and the heat sink is achieved through a thermal paste or a thermally conductive polymer.

Disadvantages of presently available power module designs such as those described hereinabove include relatively high parasitic impedance, high volume and weight, high thermal resistance, and limited reliability primarily due to wire bonds. Accordingly, it would be desirable to provide power electronic module packaging technology that overcomes such disadvantages.

BRIEF SUMMARY OF THE INVENTION

In accordance with preferred embodiments of the present invention, a method of power electronic packaging comprises a practicable and reliable method of fabricating power circuit modules and associated connections that are compatible with the standard top layer metalization of commercially available power devices. The method comprises attaching a planar single- or multi-layer membrane structure to a carrier frame and forming a via pattern in the membrane. The single-layer structure comprises a flexible organic dielectric film; and the multi-layer structure comprises a flexible organic dielectric film bonded to a metal sheet. Either the multi-layer or single-layer structure is coated with a glue layer that is protected by a release sheet. Power devices are aligned and attached to the planar membrane structure; a top layer interconnect structure is formed by metalizing the vias and the film; and a circuit is formed by patterning a deposited metal layer. The carrier frame is removed, and upper and lower thermal base plate sub-assemblies are attached to the power device-on-membrane structure. The planar device-on-membrane structure may comprise different types of power devices having variations in thickness. The thermal base plate sub-assemblies may include integral, high-performance heat exchangers for providing a low thermal resistance path to the ambient.

BRIEF DESCRIPTION OF THE DRAWINGS

FIG. 12 illustrates in cross section upper and lower base plate sub-assemblies for a single-sided hermetic power module;

FIG. 13 illustrates a device-on-membrane structure for the module of FIG. 12;

DETAILED DESCRIPTION OF THE INVENTION

Figure 1:
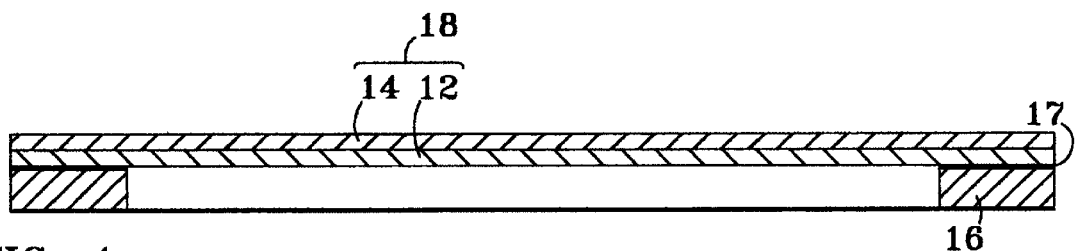
FIG. 1 illustrates in cross section a planar membrane structure on a carrier frame.

An exemplary electronic power module package is described in terms of the following process steps with reference to the drawing figures. Any dimensional and component values given herein are exemplary only for purposes of illustration and are not intended to limit the scope of the invention described herein. Similarly, specific materials are exemplary only for purposes of illustration.

As illustrated in FIG. 1, a single-layer (14) or a multi-layer (12 and 14) structure is attached to a carrier frame 16. The multi-layer structure comprises a thin metal layer (preferably copper) 12 and a layer of organic dielectric material (e.g., a polymer film) 14 attached to the carrier frame 16. Alternatively, the single-layer structure comprises the organic dielectric (e.g., polymer film) 14 attached to the frame 16. The single-layer (14) or multi-layer structure (14 and 12) is also referred to herein as comprising a membrane 18.

An exemplary carrier frame 16 comprises a circular or square-shaped metal ring with a bonding layer 17. Carrier frame 16 comprises a suitable dielectric material, such as a polyimide film, e.g., Kapton polyimide film sold by E.I. duPont de Nemours and Company. The polymer film layer 14 is in a flat and stretched condition for processing. In particular, polymer film layer 14 is attached to carrier frame 16 in a lamination process during which bond layer 17 is cured at high temperature (e.g., up to 300° C.) and pressure (e.g., several hundreds of psi). During a cool down cycle in the lamination process, the polymer layer stretches. And since carrier frame 16 has a lower coefficient of thermal expansion (CTE) than that of polymer film layer 14, the polymer layer remains in a stretched state after the cool down to room temperature. The carrier frame provides a convenient way for transport, ease of handling and dimensional stability for the power device-on-membrane structure fabricated thereon, as described below.

Organic dielectric (or polymer film) layer 14 is chosen to have particular thermal, structural and electrical properties, depending on the particular application. The laminated polymer layer 14 preferably has a low modulus (high compliance), low x, y and z-axis CTE, and a high glass transition temperature $T_g$ or melting temperature $T_m$, thereby improving the thermal/structural reliability of the resulting power module interconnect. Polymer film layer 14 may comprise a ceramic-filled composite polymer such as, for example, aluminum nitride (AIN)- or aluminum oxide ($Al_2O_3$)-filled poly-tetrafluoro-ethylene (PTFE); or polyimide cyanide ester- or bismaleimide triazine (BT)-epoxy-infiltrated PTFE resin matrix-based laminate materials from Gore Associates.

Figure 2:
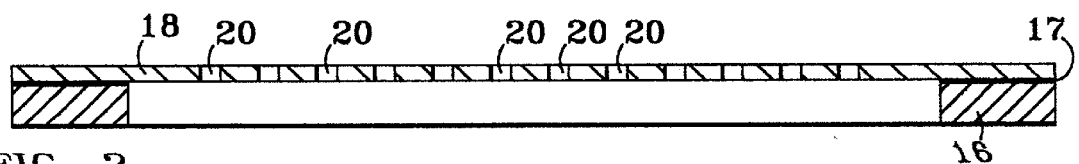
FIG. 2 illustrates application of a via pattern in the structure of FIG. 1.

FIG. 2 illustrates stepping and punching a via (20) pattern in the single or multi-layer membrane 18 for device power and control connections. Forming the via pattern can be accomplished by mechanical punching or laser processing. Both the frame 16 and the laminated copper sheet 12 (FIG. 1) improve the dimensional stability of the membrane 18, allowing tighter spacing for punched vias 20. Increased via (20) density advantageously reduces resistive losses and current crowding. An exemplary configuration comprises 0.020 inch diameter vias on 0.050 inch staggered centers.

Figure 3:
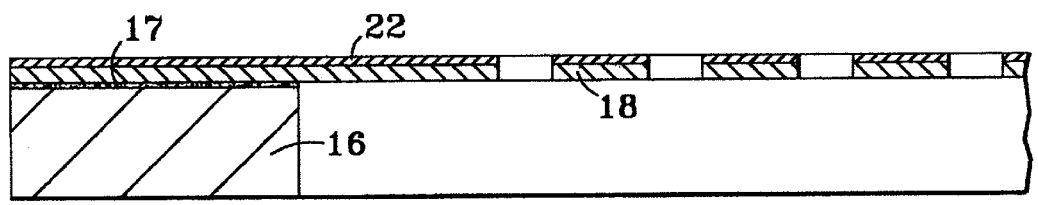
FIG. 3 illustrates application of a bond layer to the structure of FIG. 2.

FIG. 3 illustrates applying a partially cured polymer resin (e.g., acrylic or epoxy) over the dielectric side 14 (FIG. 1) of the membrane 18 as a bond, or glue, layer 22. An exemplary bond layer 22 is approximately 0.0005 inch thick. Application of the bond layer may take place before or after the via (or hole) 20 formation process. In addition, a protective release layer (not shown) may be applied over the bond layer to keep the bond layer clean during the via formation process.

Figure 4:
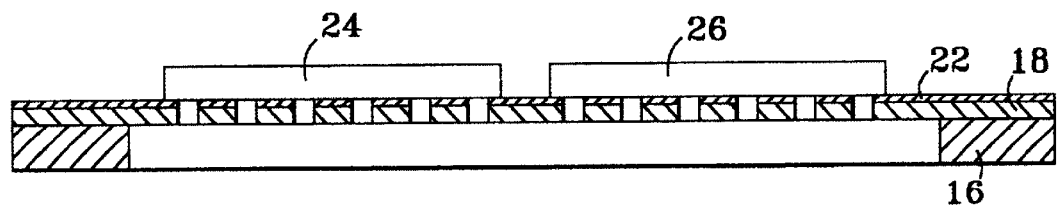
FIG. 4 illustrates application of power devices to the structure of FIG. 3 and thus the resulting planar device-on-membrane structure.

FIG. 4 illustrates attaching power devices to the bond layer 22. Two devices 24 and 26 are provided by way of example only. In order to bond the devices, the structure is cured in a vacuum oven under low pressure. During the curing process, some resin from the bond layer may be extruded into the punched holes (or vias) 20, resulting in a ring (28, FIG. 5) of cured bonding polymer covering the device metalization about each hole. The diameter of the punched holes, the temperature and pressure of the curing process, and the thickness of the glue layer determine the width of the extruded polymer ring. For example, for the case of a 0.0005 inch laser-drilled hole, the entire power device (i.e., die) surface may be covered with the polymer resin. For example, if the thickness of the bond layer and the diameter of the hole were of the same order of magnitude, then a polymer resin layer having a thickness on the order of tenths of an inch would likely cover the die surface.

For an exemplary polymer resin surface on the order of 0.0005 inch, reactive ion etching or sputter cleaning of the resin off the die surface may be difficult, expensive and impracticable. However, if the diameter of the punched vias were, for example, orders of magnitude bigger than the thickness of the bond layer, then only a small fraction of the via area would be covered by the extruded polymer layer. In such case, cleaning the polymer resin off the metalized contact surfaces of the power devices may not be necessary.

Figure 5:
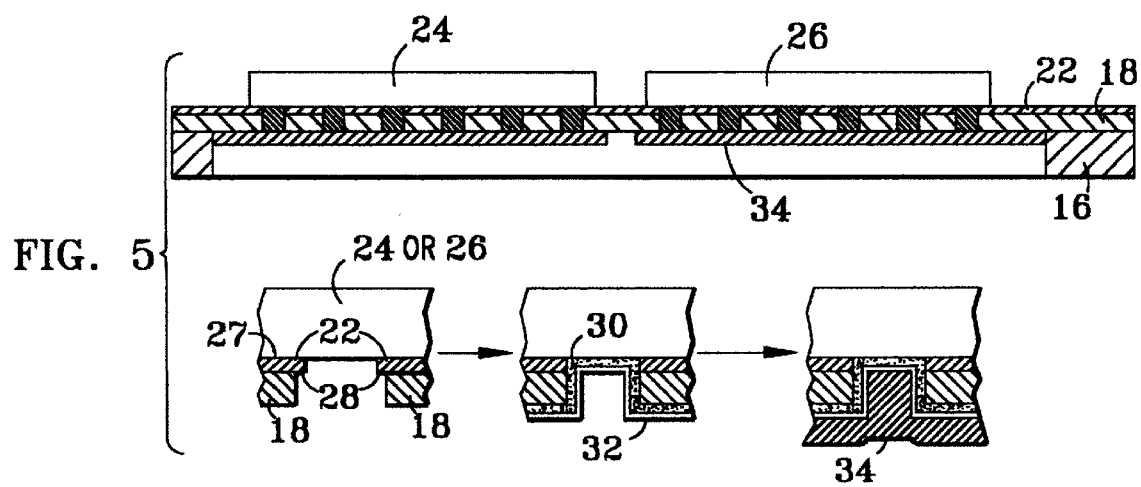
FIG. 5 illustrates removal of the excess bond layer, sputter cleaning of the metal contacts, sputtering adhesion and seed layers, and electroplating of the structure of FIG. 4 to form a desired circuit pattern.

As illustrated in FIG. 5, the residual bond layer 22 and a thin layer of aluminum oxide (not shown) are sputter-cleaned from the top layer metalization 27 (e.g., aluminum) of the power devices. (A non-conductive oxide layer results from normal oxidation of aluminum at standard atmospheric conditions; such an oxide layer needs to be removed prior to metalization.) The cleaning process is followed by blanket sputtering of a layer of adhesion metal 30 and a layer of conductive seed metal (32) over the aluminum metalization. Suitable adhesion and conductive metal layers comprise a couple of thousands of angstroms thick titanium and copper, respectively. Subsequently, a conductive copper layer 34 (e.g., approximately 0.005 inch to 0.010 inch thick) is electroplated over the sputtered seed copper layer. The plated blanket copper layer is then subtractively patterned to form the power and control circuits and their input/output pads. (The power and control circuits are designated generally in FIG. 7 by the numeral 35.)

Another alternative is to form the power circuit semi-additively where selective electroplating to the desired copper thickness is accomplished through an exposed and developed photoresist. The thin adhesion layer 30 and seed layer 32 are then removed by blanket etching the circuit. The patterned copper land and traces are subsequently plated with an electroless nickel layer (e.g., approximately 200 $\mu$inch thick) followed by electroless gold layers (e.g., approximately 10 $\mu$inch thick). C(he electroless nickel and gold layers are not shown.)

Figure 6:
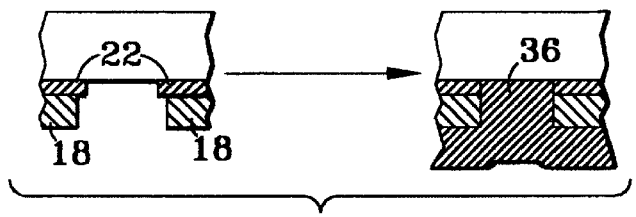
FIG. 6 illustrates removal of the bond layer, sputter cleaning of the metal contacts, and ion vapor deposition of the structure of FIG. 4.

Another alternative approach involves sputter-cleaning the excess bond layer and the oxide layer with argon plasma followed by ion vapor deposition (IVD) of an aluminum layer 36 (e.g., approximately 0.005 inch to 0.010 inch thick) through a metal mask that will form both the power and control circuits and the input/output pads, as shown in FIG. 6. The shadowed aluminum metal is cleaned off by a blanket etching process that reduces the metal thickness over the entire membrane. Subsequently, the assembly is plated over with an electroless nickel layer (e.g., approximately 200 $\mu$inch thick) and an electroless gold layer (e.g., approximately 10 $\mu$inch thick) for corrosion protection and solderability. (The electroless nickel and gold layers are not shown.)

After completion of the processing steps illustrated in FIGS. 1–6, carrier frame 16 (FIG. 1) is removed from the power device-on-membrane structure 38 such that the power circuit module is ready for packaging as described in the ensuing process steps.

Figure 7:
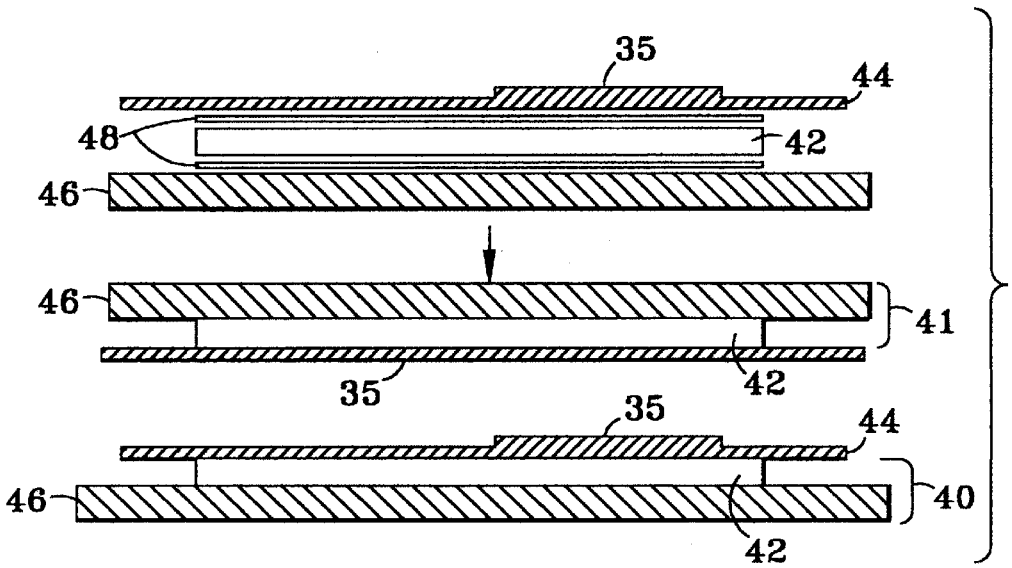
FIG. 7 illustrates fabrication of thermal base sub-assemblies.

FIG. 7 illustrates fabrication of electrically-insulating, thermally-conducting base plate sub-assemblies 40 and 41 for packaging the power circuit module. An exemplary base is fabricated by metalizing a ceramic plate 42 (e.g., comprised of a ceramic aluminum nitride, beryllia or alumina) with copper 44. In one embodiment, an aluminum plate 42 (e.g., approximately 0.040 inch thick) is metalized with copper 44 and a copper molybdenum (CuMo30) plate 46. (CuMo30 is a composite material made by infiltrating a porous molybdenum base with copper.) Active braze preforms 48 are used to attach the copper and CuMo30 plates to the aluminum nitride thermal plates, thereby forming the lower and upper base plate sub-assemblies 40 and 41, respectively. In particular, the power circuit module is fabricated by directly active-brazing one or more physically separated layers of copper sheets 44, each having a different thickness with respect to the aluminum nitride thermal plate. The copper sheets are preferably over-sized with respect to the underlying aluminum nitride base. The over-sized copper sheets are etched to provide a design-specific pattern having different levels of thickness, e.g., three level including zero thickness, the full thickness of the original copper sheet 12 (FIG. 1), and a fractional thickness of the original copper sheet. The selective etching process is preferably performed in multiple steps in order to provide the desired circuit pattern and desired thickness variations. Such thickness variations advantageously accommodate variations in thickness of different types of power devices. For example, thickness variations of 0.015 inch can be accommodated in a step-wise fashion. The screened and re-flowed solder thickness (approximately 0.003 inch, for example) helps to accommodate statistical variations in thickness of the power devices and etched layers, each of which is usually less than +/−0.001 inch.

Figure 8:
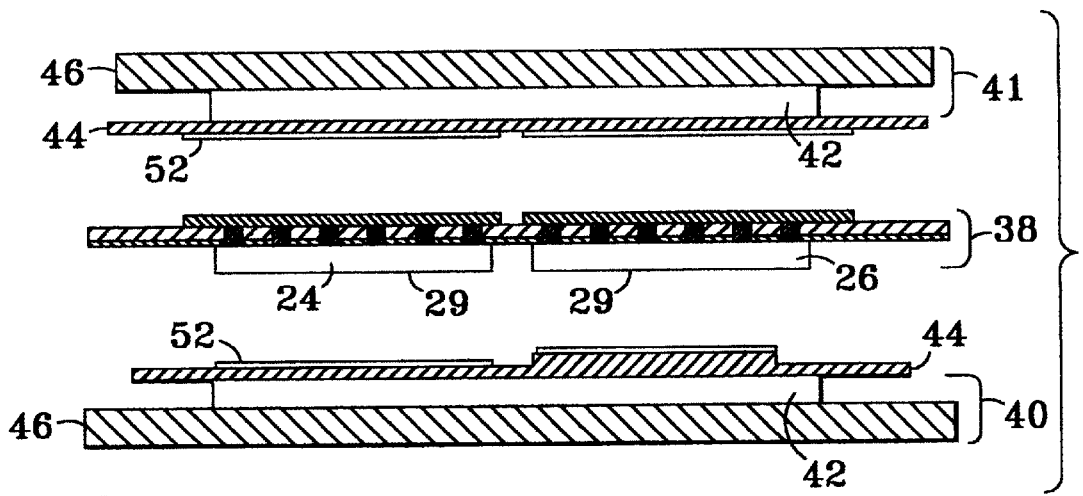
FIG. 8 illustrates application of upper and lower thermal base sub-assemblies of FIG. 7 to the device-on-membrane structure of FIG. 4.

As illustrated in FIG. 8, the backside metalization 29 of the power devices 24 and 26 of the power device-on-membrane structure 38 is soldered via solder layers 52 to the copper metalization 44 of the lower and upper base plate sub-assemblies 40 and 41, respectively. Exemplary soldering processes involve a single- or double-step, fluxless soldering process in a reducing atmosphere.

Figure 9:
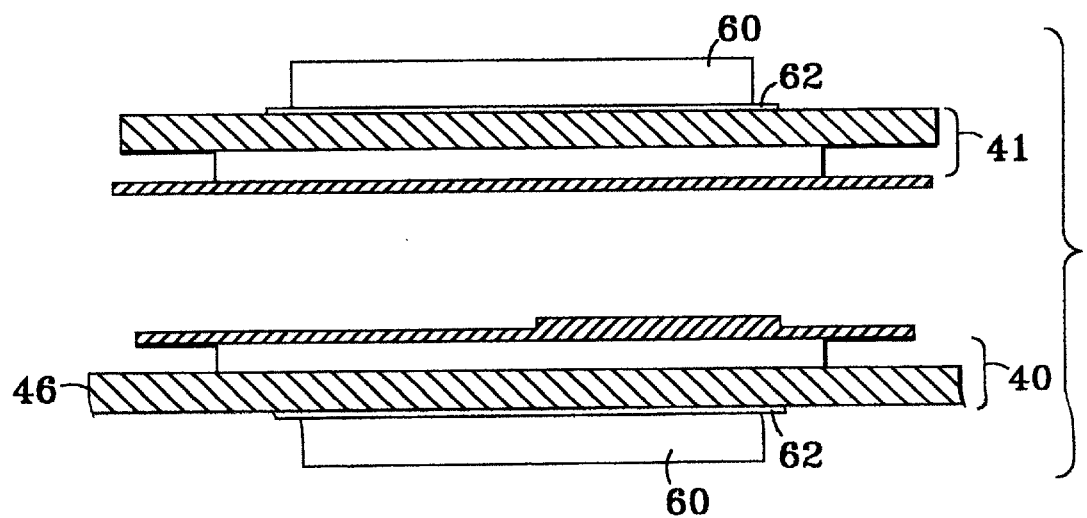
FIG. 9 illustrates attachment of heat exchangers to the thermal base sub-assemblies of FIG. 7.

Advantageously, the planarity of the structure provides for a double-sided cooled module design. FIG. 9 shows attachment of compact, integral heat exchangers 60 to the lower and upper base plate sub-assemblies 40 and 41, respectively. In particular, the heat exchangers are illustrated as being soldered to the base plate sub-assemblies through solder layers 62.

Figure 10:
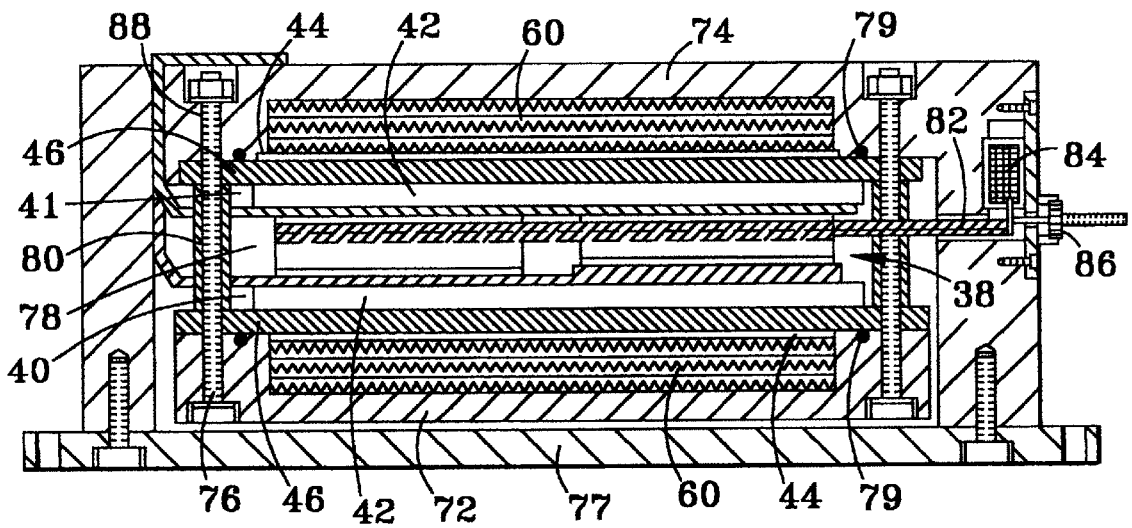
FIG. 10 illustrates in cross section a non-hermetic double-sided-cooled power module.
Figure 11:
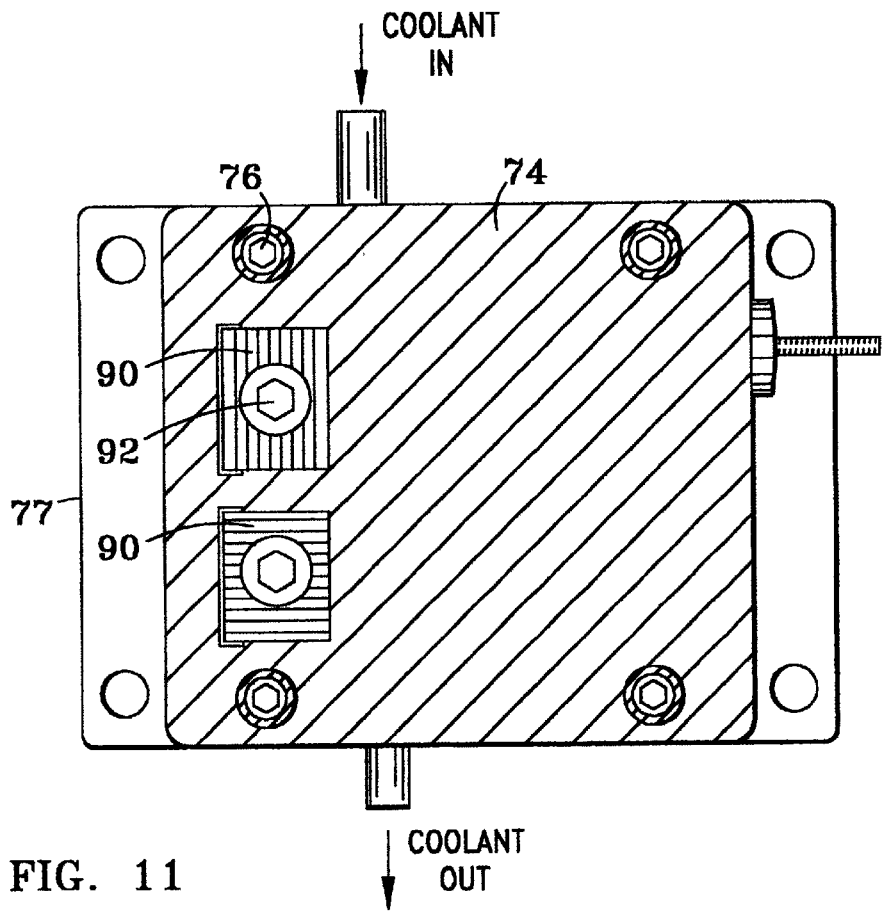
FIG. 11 is a top view of the module of FIG. 10.

For an exemplary non-hermetic power module 70, as illustrated in FIGS. 10–11, the copper-metalized aluminum nitride thermal plates 44 are attached to infiltrated copper-molybdenum plates 46, as described above with reference to FIG. 9. An exemplary thickness of copper-molybdenum plates 46 is in a range from 0.050 inch to 0.100 inch, depending on the module size and stiffness requirements. In a preferred embodiment, the copper-molybdenum sheets 46 and integral-reticulated, metal-based, compact, high performance heat exchangers 60 are bonded to the aluminum-nitride thermal plates 42 prior to the solder-attach process, as illustrated in FIG. 9. As illustrated in FIG. 10, liquid or air coolant enclosures 72 and 74 are sealed against the copper-molybdenum plates using module clamping screws 76. Also, the lower coolant enclosure 72 is illustrated as being embedded in the upper coolant enclosure 74, and sealed with a cover plate 77 using seal rings 79. The upper and lower base plate sub-assemblies 41 and 40, respectively, are separated from each other by a distance 78 to provide the spacing required by the thickness of the device-on-membrane 38 and the bonding solder layers. The separation distance 78 is controlled by expansion match spacers 80. Interfaces between the solder joints and semiconductor devices of the device-on-membrane structure 38 are protected against shear and normal loads by the rigid structure formed by the copper-molybdenum plates and the spacers. Furthermore, the lower base plate sub-assembly 40 (with integral heat exchanger) is contained in enclosure (or cavity) 72, which provides damping and stress isolation against loads. A metalized and patterned extension 82 of the dielectric film supporting the device-on-membrane structure 38 is formed to provide stress-relieved connections to gate control circuits 84 and external connectors 86, which are integrated into the upper base assembly enclosure 74. The upper cavity 74 has slots 88 formed therein through which power electrodes extend and form external power bus connections 90, as shown in FIG. 11. Capture nuts 92 embedded in the upper cavity help to form secured and reliable connections to the external power bus.

FIG. 12 illustrates an exemplary single-sided hermetic power module configuration 100. Although the embodiment of FIG. 12 is single-sided and does not employ integral heat exchangers in the base plate sub-assemblies, those of ordinary skill in the art will understand that double-sided connections and single- or double-sided integral heat exchangers may readily be incorporated into any such module in accordance with the description given hereinabove.

In one embodiment of the single-sided hermetic power module 100, power vias 120 for high current applications are constructed from CTE-matched CuMo30 disks 102 contained loosely within vias 120, thereby avoiding any stress resulting from a CTE mismatch which could otherwise lead to hoop cracks for particularly large vias, for example. CuMo30 disks 102 offer good electrical and thermal conductivity and essentially stress-free, high-reliability power and control via connections. Copper sheets 104 actively brazed in a high vacuum hermetically seals the CuMo30 disks 102 and form vertical metal-to-metal connections for both thermal and electrical functions. A frame 106 (e.g., comprising molybdenum or alumina, for example) bonded to the upper base plate sub-assembly 41 functions as a substantially stress-free CTE-matched spacer while hermetically sealing the module cavity.

FIG. 13 illustrates a device-on-membrane structure 138 suitable for incorporation into the hermetic power module 100 of FIG. 9. Structure 138 includes CTE-matched slugs 110 for routing the power connections from the lower base sub-assembly 140 to the upper base sub-assembly 141 (FIG. 12).

Figure 14:
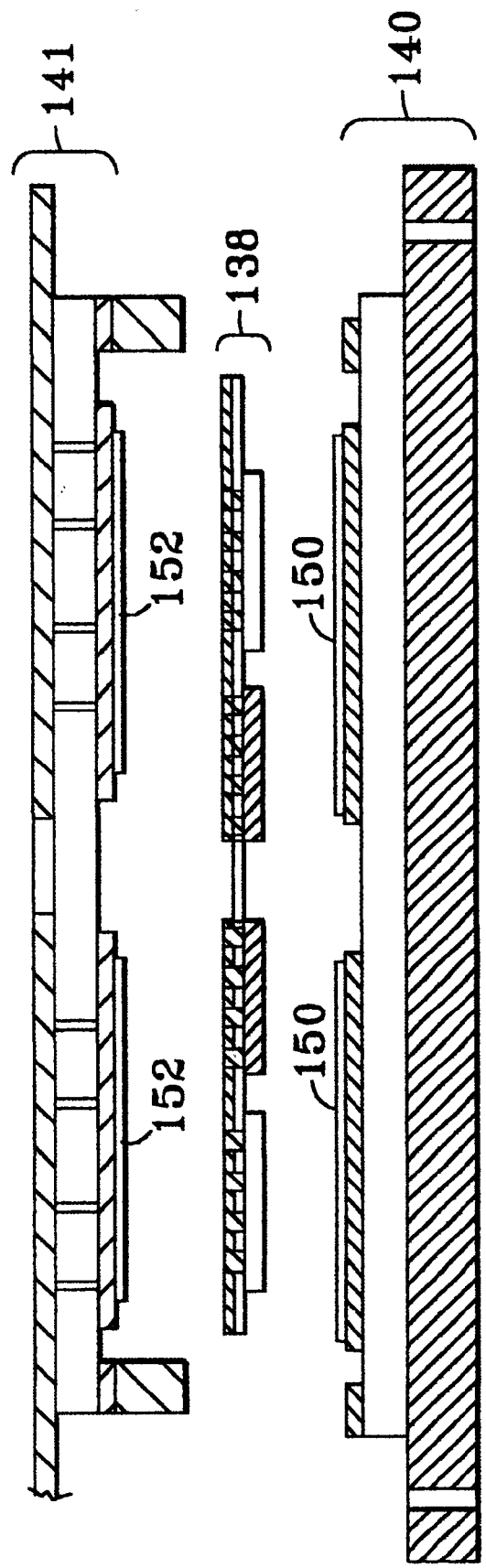
FIG. 14 illustrates assembly of the single-sided hermetic power module components of FIGS. 12 and 13.
Figure 15:
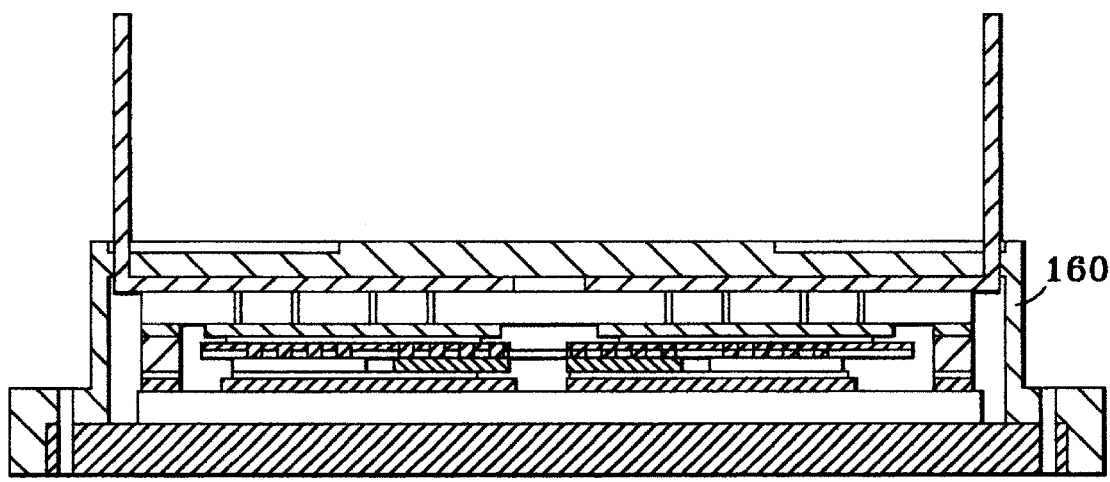
FIG. 15 illustrates cross sectional and top views of an assembled single-sided hermetic power module including the components of FIG. 14.
Figure 16:
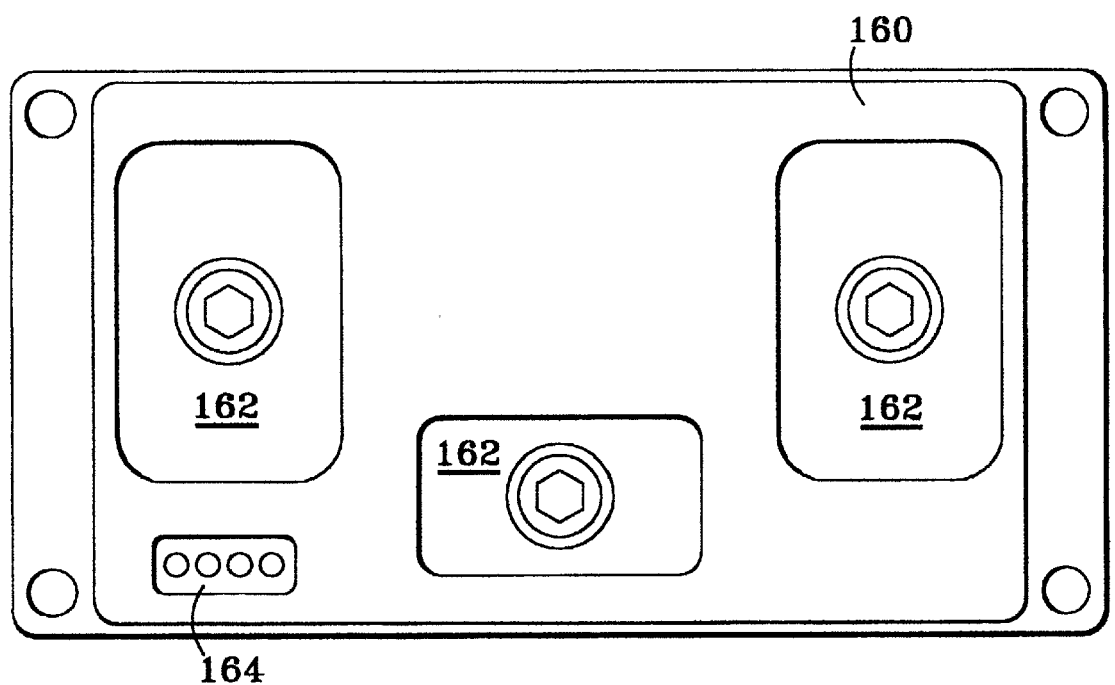
FIG. 16 illustrates a top view of an assembled power module

Final assembly of the power module may comprise either a single- or double-step sealing process. A two-step process involves a hierarchy of melting points. In particular, a high-melting-point solder (SEH) 150 and a low-melting-point solder (SL) 152 would be reflown over the power circuits of the upper and lower base plate sub-assemblies 141 and 140, respectively, as shown in FIG. 14. The first soldering step would attach the backsides of the slugs and power devices to the lower base plate sub-assembly. Prior to the second soldering step, the module is preferably tested for circuit connections and functions. The second soldering step would extend the power and control circuit connections from the device-on-membrane structure 138 to the exterior of the module. As illustrated in FIG. 15, a housing 160 (e.g., of plastic) with external power connectors 162 and control connectors 164 would then be attached to the copper-molybdenum base. Such a plastic shell would cover and protect the finished module assembly.

Use of a hermetic or non-hermetic module depends on the application. The hermetic module of FIG. 15 has all the power and control connections on the topside of the device-on-membrane structure 38. To this end, the non-hermetic module of FIG. 8 has electrically- and thermally-conducting, CTE-matched metal slugs incorporated to the device-on-membrane in order to bring the backside power connections to the top. Advantages of the single-sided hermetic module of FIGS. 12–15 include avoiding the need for sealed power vias for the lower base plate sub-assembly, avoiding the need for an additional aluminum nitride plate, and improved thermal resistance. But, an advantage of double-sided power connections is the ability to use strip-lined power electrodes, which improve power loop inductance. (Strip-lined power electrodes comprise parallel overlapping conductor strips with a well-defined spacing in a dielectric medium.)

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A power circuit module, comprising:
   a planar device-on-membrane structure comprising at least one power device attached to a planar membrane, the membrane having metalized vias formed therein and the at least one power device being connected to power and control circuits through the metalized vias, the circuits being formed by metalizing the membrane and patterning prior to attachment of the power device to the planar membrane, the device-on-membrane structure having an upper portion on which the devices are attached and having a lower membrane portion;
   at least one electrically-insulating thermal base sub-assembly attached to the device-on-membrane structure, each thermal base sub-assembly comprising metalized base plates, the thickness of the metalization being variable so as to accommodate different types of power devices having variations in thickness; and
   a sealed shell structure having a first coolant enclosure embedded in a second coolant enclosure, the coolant enclosures having cavities formed therein for containing cooling media and further comprising openings for power and control feedthroughs.

2. The power circuit module of claim 1 wherein the planar membrane comprises a single-layer organic dielectric.

3. The power circuit module of claim 2 wherein the single-layer organic dielectric comprises a polymer film.

4. The power circuit module of claim 1 wherein the planar membrane comprises a multi-layer structure comprising a metallic sheet attached to an organic dielectric film.

5. The power circuit module of claim 4 wherein the metallic sheet comprises copper and the organic dielectric film comprises a polymer film.

6. The power circuit module of claim 5 wherein the base plates each comprise a ceramic plate having two sides, one side having an etched copper sheet attached thereto, and the other side having an etched copper-molybdenum composite sheet attached thereto, the ceramic being selected from a group comprising aluminum nitride, alumina or beryllia.

7. The power circuit module of claim 1 wherein each respective thermal base sub-assembly has a heat exchanger associated therewith for providing a low thermal resistance path away from the device-on-membrane structure.

8. The power circuit module of claim 7 wherein each respective heat exchanger is integral with its associated thermal base sub-assembly.

9. The power circuit module of claim 1, comprising a single-sided module having power and control connections extending only from the upper portion thereof.

10. A double-sided power circuit module, comprising:
    a planar device-on-membrane structure comprising at least one power device attached to a planar membrane, the membrane having metalized vias formed therein and the at least one power device being connected to power and control circuits through the metalized vias, the circuits being formed by metalizing the membrane and patterning prior to attachment of the power device to the planar membrane, the device-on-membrane structure having an upper portion on which the devices are attached and having a lower membrane portion;
    at least one electrically-insulating thermal base sub-assembly attached to the device-on-membrane structure, each thermal base sub-assembly comprising metalized base plates, the thickness of the metalization being variable so as to accommodate different types of power devices having variations in thickness; and
    power and control connections extending from both the upper and lower portions thereof.

11. The power circuit module of claim 1, further comprising an extension of the membrane for providing electrical signal paths integral to the device-on-membrane structure.

12. The power circuit module of claim 1, comprising upper and lower electrically-insulating thermal base subassemblies attached to the upper and lower portions, respectively, of the device-on-membrane structure.

13. A power circuit module, comprising:
    a planar device-on-membrane structure comprising at least one power device attached to a planar membrane, the membrane having metalized vias formed therein and the at least one power device being connected to power and control circuits through the metalized vias, the circuits being formed by metalizing the membrane and patterning prior to attachment of the power device to the planar membrane, the device-on-membrane structure having an upper portion on which the devices are attached and having a lower membrane portion;
    at least one electrically-insulating thermal base sub-assembly attached to the device-on-membrane structure, each thermal base sub-assembly comprising metalized base plates, the thickness of the metalization being variable so as to accommodate different types of power devices having variations in thickness, the power circuit module of claim 1, comprising metal disks loosely contained within the vias, the metal disks having low thermal expansion and high electrical conductivity, thereby providing a substantially stress-free via structure; and
    metal disks loosely contained within the vias, the metal disks having low thermal expansion and high electrical conductivity, thereby providing a substantially stress-free via structure.

14. A power circuit module, comprising:
    a planar device-on-membrane structure comprising at least one power device attached to a planar membrane, the membrane having metalized vias formed therein and the at least one power device being connected to power and control circuits through the metalized vias, the circuits being formed by metalizing the membrane and patterning prior to attachment of the power device to the planar membrane, the device-on-membrane structure having an upper portion on which the devices are attached and having a lower membrane portion;
    at least one electrically-insulating thermal base sub-assembly attached to the device-on-membrane structure, each thermal base sub-assembly comprising metalized base plates, the thickness of the metalization being variable so as to accommodate different types of power devices having variations in thickness; and
    an hermetically sealed structure for housing the device-on-membrane structure, the hermetically sealed structure comprising an upper portion and a lower portion sealed through a metalized seal band.

15. A power circuit module, comprising:
    a planar device-on-membrane structure comprising at least one power device attached to a planar membrane, the membrane having metalized vias formed therein and the at least one power device being connected to power and control circuits through the metalized vias, the circuits being formed by metalizing the membrane and patterning prior to attachment of the power device to the planar membrane, the device-on-membrane structure having an upper portion on which the devices are attached and having a lower membrane portion;

at least one electrically-insulating thermal base subassembly attached to the device-on-membrane structure, each thermal base sub-assembly comprising metalized base plates, the thickness of the metalization being variable so as to accommodate different types of power devices having variations in thickness; and an hermetically sealed structure formed by a metal frame for housing the device-on-membrane structure.

* * * * *

UNITED STATES PATENT AND TRADEMARK OFFICE
CERTIFICATE OF CORRECTION

PATENT NO.       : 6,377,461 B1
APPLICATION NO.  : 09/710237
DATED            : April 23, 2002
INVENTOR(S)      : Ozmat et al.

Page 1 of 1

It is certified that error appears in the above-identified patent and that said Letters Patent is hereby corrected as shown below:

Col. 8, lines 31 through 36 (Claim 13), delete "thickness, the power circuit module of claim 1, comprising metal disks loosely contained within the vias, the metal disks having low thermal expansion and high electrical conductivity, thereby providing a substantially stress-free via structure; and" and substitute therefore -- thickness; and --.

Signed and Sealed this
Twenty-first Day of June, 2011

David J. Kappos
*Director of the United States Patent and Trademark Office*